(12) United States Patent
Chang

(10) Patent No.: US 11,175,310 B2
(45) Date of Patent: Nov. 16, 2021

(54) METHOD FOR UPGRADING AN AUTOMATIC TESTING SYSTEM

(71) Applicant: Chien Wen Chang, Taoyuan (TW)

(72) Inventor: Chien Wen Chang, Taoyuan (TW)

( * ) Notice: Subject to any disclaimer, the term of this patent is extended or adjusted under 35 U.S.C. 154(b) by 161 days.

(21) Appl. No.: 16/533,953

(22) Filed: Aug. 7, 2019

(65) Prior Publication Data

US 2021/0041481 A1 Feb. 11, 2021

(51) Int. Cl.
  *G01R 1/067* (2006.01)
  *H01R 11/12* (2006.01)
  *H01R 11/22* (2006.01)
  *G01R 1/073* (2006.01)
  *H01R 4/48* (2006.01)

(52) U.S. Cl.
  CPC ......... *G01R 1/06722* (2013.01); *H01R 11/12* (2013.01); *H01R 11/22* (2013.01); *G01R 1/07342* (2013.01); *H01R 4/4854* (2013.01); *H01R 2201/20* (2013.01)

(58) Field of Classification Search
  CPC .. G01R 1/06722; G01R 1/7342; H01R 11/12; H01R 11/22; H01R 4/4854; H01R 2201/20
  See application file for complete search history.

(56) References Cited

U.S. PATENT DOCUMENTS

| | | | |
|---|---|---|---|
| 6,348,810 B1 * | 2/2002 | Yanagawa | G01R 1/07378 324/754.03 |
| 8,337,256 B1 * | 12/2012 | Lin | H01R 12/7094 439/700 |
| 2009/0243643 A1 * | 10/2009 | Ni | G01R 31/2806 324/757.02 |

* cited by examiner

*Primary Examiner* — Paresh Patel

(57) ABSTRACT

A method for upgrading an automatic testing system includes electrically connecting at least one pogo pin attaching device to an expansion instrument and a pogo pin of a pogo pin interface of the automatic testing system wherein the pogo pin attaching device comprises at least one metal attaching member and at least one cable, each of said at least one cable having two opposite ends, a first end electrically connected to the metal attaching member and a second end electrically connected to the expansion instrument, and the metal attaching member attaches to the pogo pin. In response to operating the automatic testing system, electrically connecting the pogo pin to a subject so that a measurement path is established between the subject and the expansion instrument through the pogo pin attaching device, wherein the measurement path is configured to connect signals for upgrading the automatic testing system.

10 Claims, 8 Drawing Sheets

S1: electrically connecting at least one pogo pin attaching device 10 to an expansion instrument 20 and a pogo pin 24 of a pogo pin interface 26 of an automatic testing system in which the pogo pin attaching device 10 comprises at least one metal attaching member 14 and at least one cable 18 having two ends electrically connected to the metal attaching member 14 and the expansion instrument 20 respectively, and the metal attaching member 14 attaches to the pogo pin 24.

S2: based on the operating procedure of the automatic testing system, electrically connecting the pogo pin 24 to a subject 40 so that a measurement path is established between the subject 40 and the expansion instrument 20 through the pogo pin attaching device 10. The measurement path may connect signals to implement upgrades of the automatic testing system. In an embodiment, the subject 40 is a wafer cooperating with a probe card 25 which serves as a probing interface.

FIG. 1

METHOD FOR UPGRADING AN AUTOMATIC TESTING SYSTEM

BACKGROUND OF THE INVENTION

1. Field of the Invention

The invention relates to upgrading methods and more particularly to a method for upgrading an automatic testing system by cooperating with a pogo pin attaching device which is electrically connected to an expansion instrument and a pogo pin of a pogo pin interface of the automatic testing system respectively to integrate the expansion instrument into the automatic testing system, thereby expanding functionality or upgrading capability of the automatic testing system.

2. Description of Related Art

Conventionally, in wafer fabrication, wafer sorting test or verification of the last packaging, it is possible that an automatic testing system may be incapable of fully supporting processes of the factory due to advancements of the technology or further production capacity requirements. Thus, the automatic testing system is required to be replaced with a more advanced one or be upgraded if possible. However, a number of problems occur as detailed below.

The supplier of the automatic testing system may not be fully aware of new applications of their clients. In the design stage of the automatic testing system, it is very difficult of predicting any potential applications and thus providing comprehensive means for future upgrades. Further, for the sake of saving the manufacturing costs and getting more profits, practically the supplier does not provide many additional expansion slots or auxiliary ports to the automatic testing system.

Due to hardware limitations of the automatic testing system, it is not always appropriate to integrate an expansion instrument by means of reforming probe card or probe carrier board.

Probe cards are required to scheduled maintenance for good performance. Thus, instrument cable disconnection and reconnection are required often if the expansion instrument is directly connected on probe card. Further, how to properly keep wiring in good condition, i.e., not making wiring messy, is an issue to be addressed.

Thus, the need for improvement still exists.

SUMMARY OF THE INVENTION

It is therefore one object of the invention to provide a method for upgrading an automatic testing system, the method comprising the steps of electrically connecting at least one pogo pin attaching device to an expansion instrument and a pogo pin of a pogo pin interface of the automatic testing system wherein the pogo pin attaching device comprises at least one metal attaching member and at least one cable that having two ends electrically connected to the metal attaching member and the expansion instrument respectively, and the metal attaching member attaches to the pogo pin; and in response to operating the automatic testing system, electrically connecting to a subject so that a measurement path is established between the subject and the expansion instrument through the pogo pin attaching device to make it doable for upgrading the automatic testing system.

The invention has the following advantages and benefits in comparison with the conventional art:

Expansion slots or auxiliary ports of the automatic testing system are not required. Expandability can be made to a maximum extent. Expandability is not limited by the original design of the testing system.

An original probe card of the automatic testing system is not required to change. Cost of purchasing the probe card or maintenance cost therefore does not increase.

The pogo pin attaching approach belongs to an external expansion path without directly going through any internal circuitry of the testing system. Thus, the expansion instrument is prevented from adversely affecting the circuitry of the testing system.

The original design of the automatic testing system or the probe card is not modified. Thus, a user may remove the expansion scheme at any time and easily return the automatic testing system to its original design. This expansion scheme is completely reversible with no damaging effect.

The above and other objects, features and advantages of the invention will become apparent from the following detailed description taken with the accompanying drawings.

BRIEF DESCRIPTION OF THE DRAWINGS

FIG. 1 is a flowchart of a method for upgrading an automatic testing system according to the invention;

DETAILED DESCRIPTION OF THE INVENTION

Figure 2:
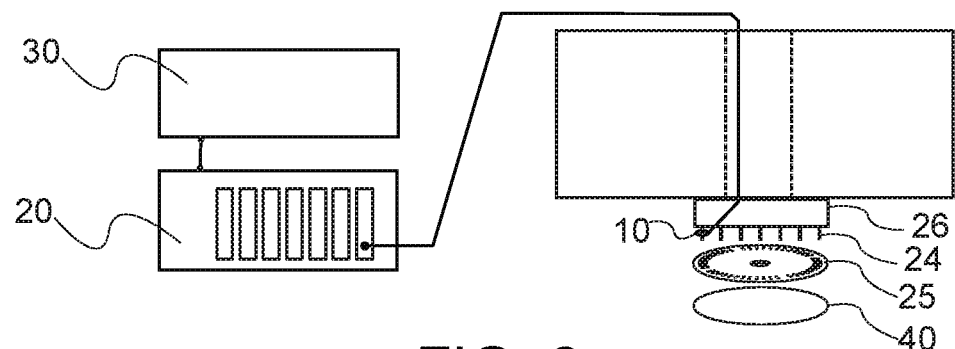
FIG. 2 schematically depicts a pogo pin attaching device interconnected an expansion instrument and a pogo pin interface according to the invention.

Referring to FIG. 1, a flowchart of a method for upgrading an automatic testing system in accordance with the invention is illustrated. Further, FIGS. 2 to 6 are referred to. The method comprises the following steps:

S1: electrically connecting at least one pogo pin attaching device 10 to an expansion instrument 20 and a pogo pin 24 of a pogo pin interface 26 of an automatic testing system in which the pogo pin attaching device 10 comprises at least one metal attaching member 14 and at least one cable 18 having two ends electrically connected to the metal attaching member 14 and the expansion instrument 20 respectively, and the metal attaching member 14 attaches to the pogo pin 24.

S2: based on the operating procedure of the automatic testing system, electrically connecting the pogo pin 24 to a subject 40 so that a measurement path is established between the subject 40 and the expansion instrument 20 through the pogo pin attaching device 10. The measurement path may connect signals to implement upgrades of the automatic testing system. In an embodiment, the subject 40 is a wafer cooperating with a probe card 25 which serves as a probing interface.

As shown in FIG. 2 specifically, the expansion instrument 20 is electrically connected to a system control computer 30 which controls the expansion instrument 20 to perform testing functions.

Figure 3:
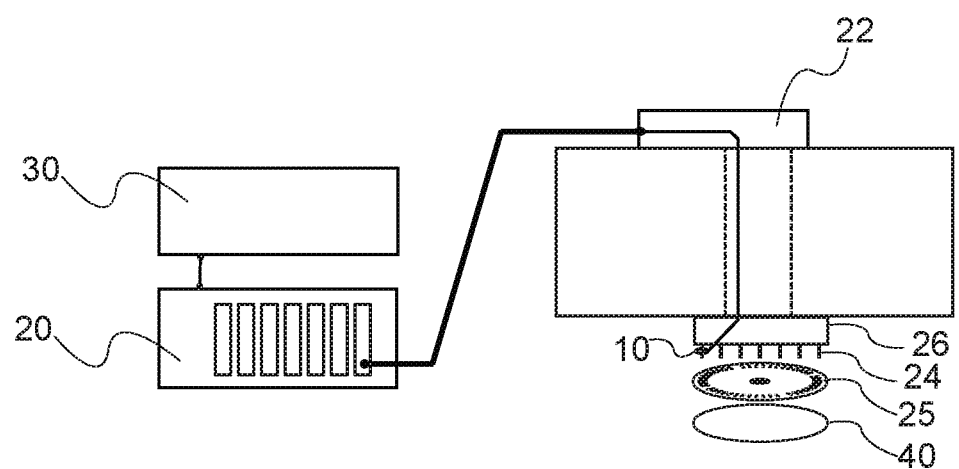
FIG. 3 schematically depicts the pogo pin attaching device connected to an expansion instrument via a wire box as a relay, and further connecting the expansion instrument to a system control computer according to the invention.

As shown in FIG. 3 specifically, a wire box 22 is electrically interconnected the expansion instrument 20 and the pogo pin attaching device 10. The wire box 22 is used to relay a cable connected to the expansion instrument 20 so that the pogo pin 24 or the pogo pin attaching device 10 can be prevented from being damaged due to excessive tension of the cabling for the expansion instrument 20.

Figure 4:
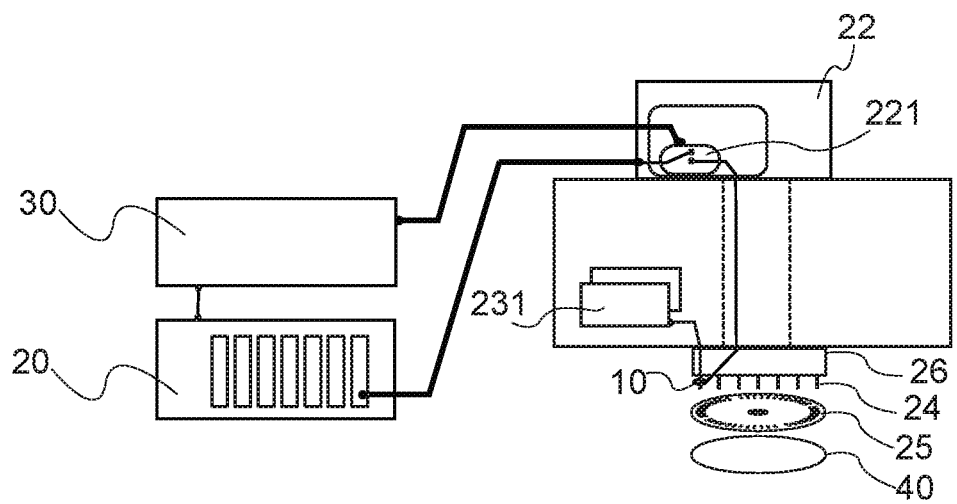
FIG. 4 schematically depicts a relay module in the wire box according to the invention.

As shown in FIG. 4 specifically, a relay module 221 is provided in the wire box 22 and programmable. The relay module 221 is connected to the system control computer 30. Thus, the system control computer 30 may execute software programs to turn on the relay module 221 to interconnect the pogo pin attaching device 10 and the expansion instrument 20 for signal communication or turn off the relay module 221 to disconnect the pogo pin attaching device 10 from the expansion instrument 20 and its long cabling. Thus, interference to a sensitive measurement device 231 of the automatic testing system caused by the attaching path of the pogo pin attaching device 10 is decreased to a minimum. For example, some automatic testing systems may have function of testing sensitive small current or small capacitance. Such function supported by the sensitive measurement device 231 may be greatly interfered if the attaching path of the pogo pin attaching device 10 is not properly isolated. Further, if there is worry of the expansion instrument 20 being damaged and thus the expansion instrument 20 shouldn't always keep attached to the pogo pin 24, it is envisaged by the invention that the relay module 221 may provide appropriate isolation.

Figure 5:
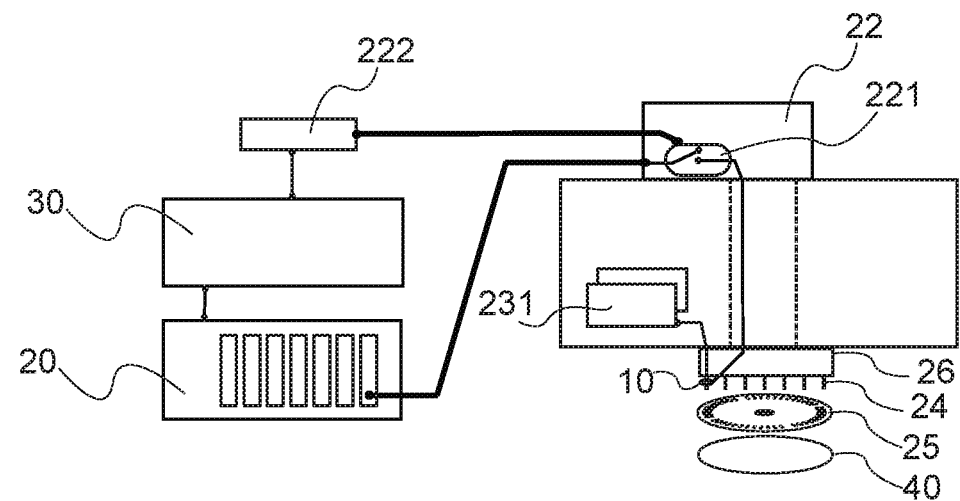
FIG. 5 schematically depicts a relay driving unit disposed externally of the wire box according to the invention.

As shown in FIG. 5 specifically, for simplifying circuitry of the wire box 22, a relay driving unit 222 is provided externally of the wire box 22. The relay driving unit 222 is electrically connected to the relay module 221 in the wire box 22 and the system control computer 30 respectively. Further, the system control computer 30 executes software programs to control the relay driving unit 222. As a result, the purposes of simplifying the circuitry of the relay module 221 in the wire box 22, decreasing heat dissipation of the wire box 22, and decreasing size of the wire box 22 can be obtained.

Figure 6:
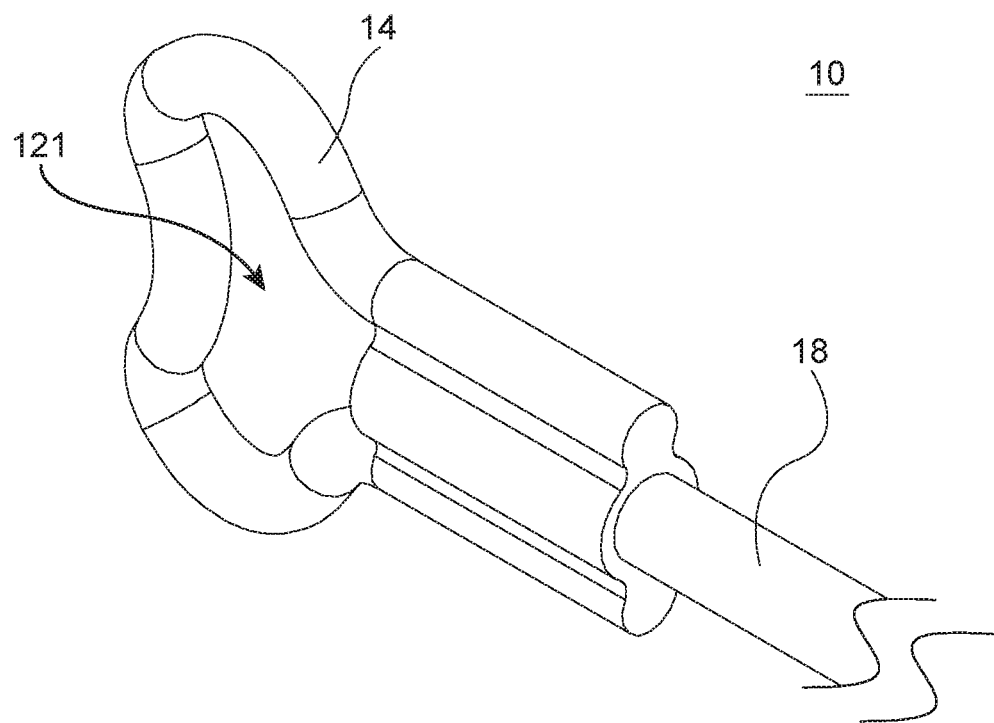
FIG. 6 is a perspective view of a pogo pin attaching device according to a first preferred embodiment of the invention.
Figure 7:
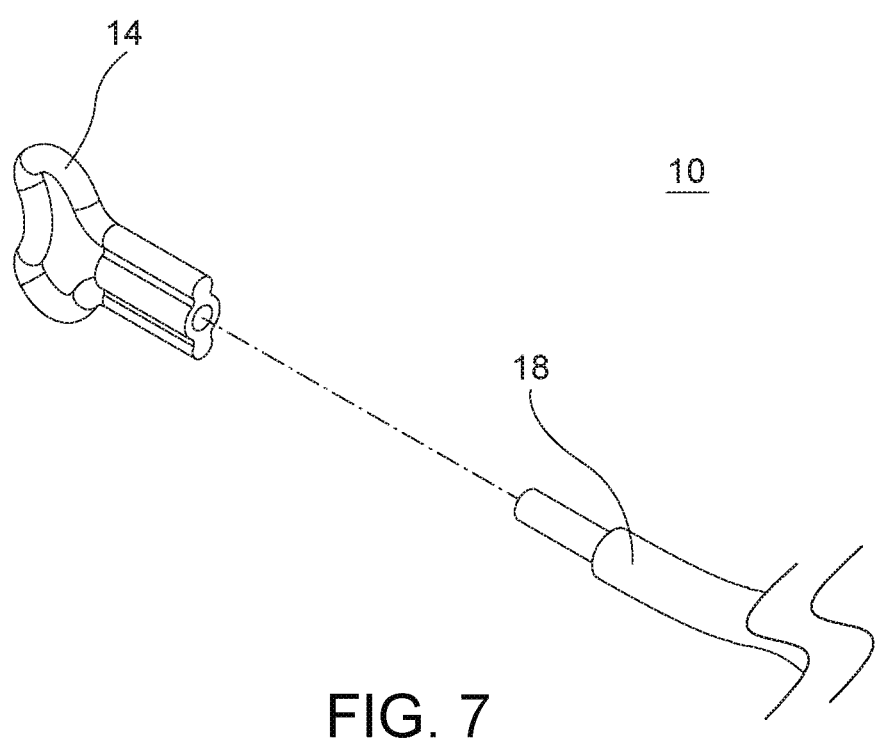
FIG. 7 is an exploded view of FIG. 6.

Referring to FIGS. 6 and 7 in cooperation with FIG. 2, in a first preferred embodiment of the pogo pin attaching device 10 of the invention, the pogo pin attaching device 10 is comprised of a metal attaching member 14 and a cable 18 electrically connected to the metal attaching member 14. The metal attaching member 14 includes a through hole 121 configured to put on a pogo pin 24.

Figure 8:
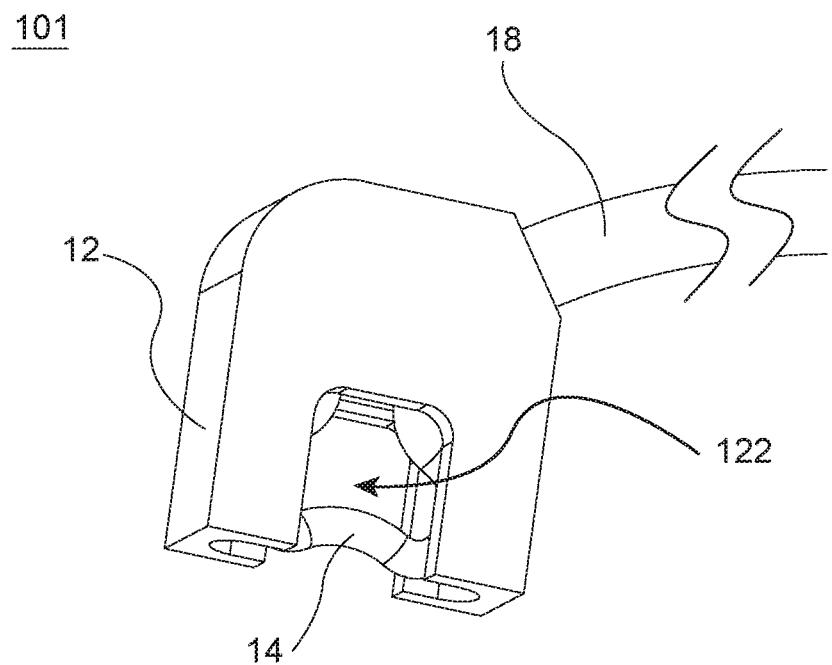
FIG. 8 is a perspective view of a pogo pin attaching device according to a second preferred embodiment of the invention.
Figure 9:
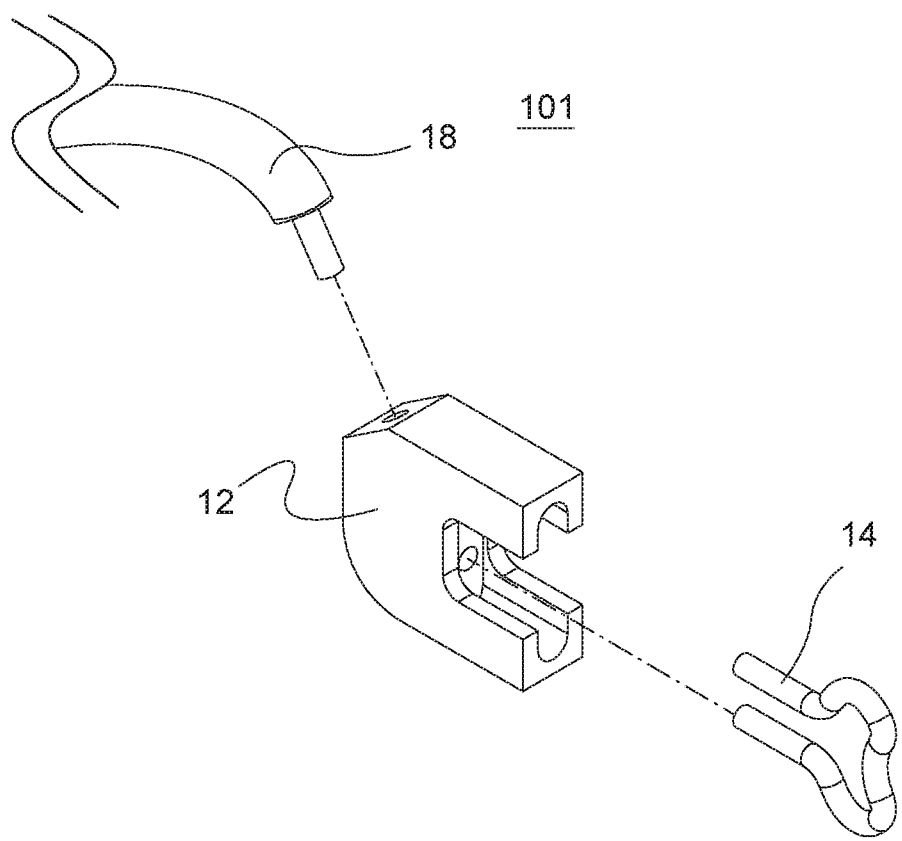
FIG. 9 is an exploded view of FIG. 8.

Referring to FIGS. 8 and 9 in cooperation with FIG. 2, in a second preferred embodiment of a pogo pin attaching device 101 of the invention, the pogo pin attaching device 101 is comprised of an insulating member 12, a metal attaching member 14 and a cable 18 electrically connected to the metal attaching member 14. The metal attaching member 14 is implemented as a wire form spring with the insulating member 12 mounted thereon. A through hole 122 is formed by the metal attaching member 14 and the insulating member 12 and is configured to put on a pogo pin 24.

Figure 10:
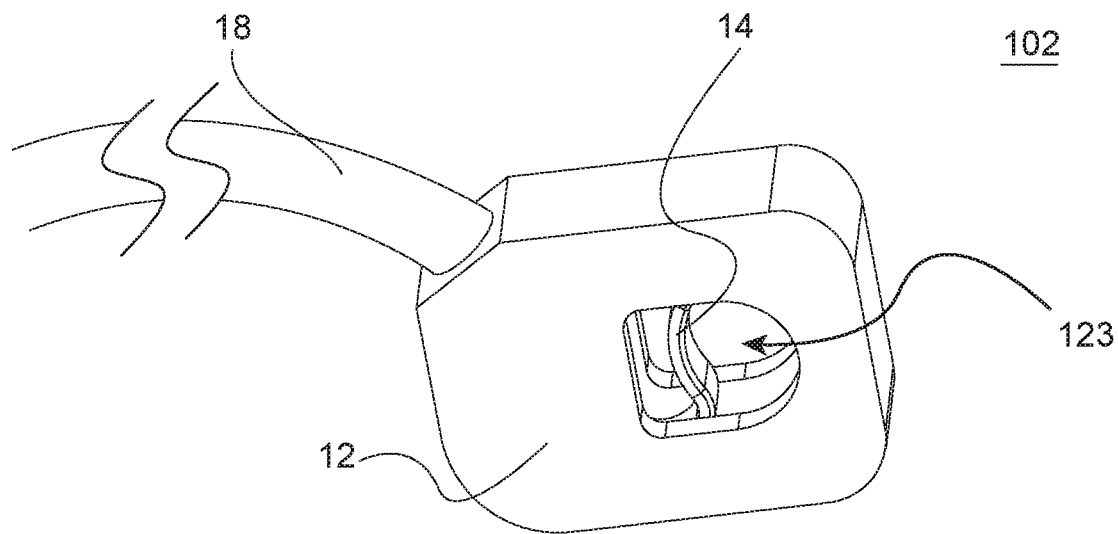
FIG. 10 is a perspective view of a pogo pin attaching device according to a third preferred embodiment of the invention.
Figure 11:
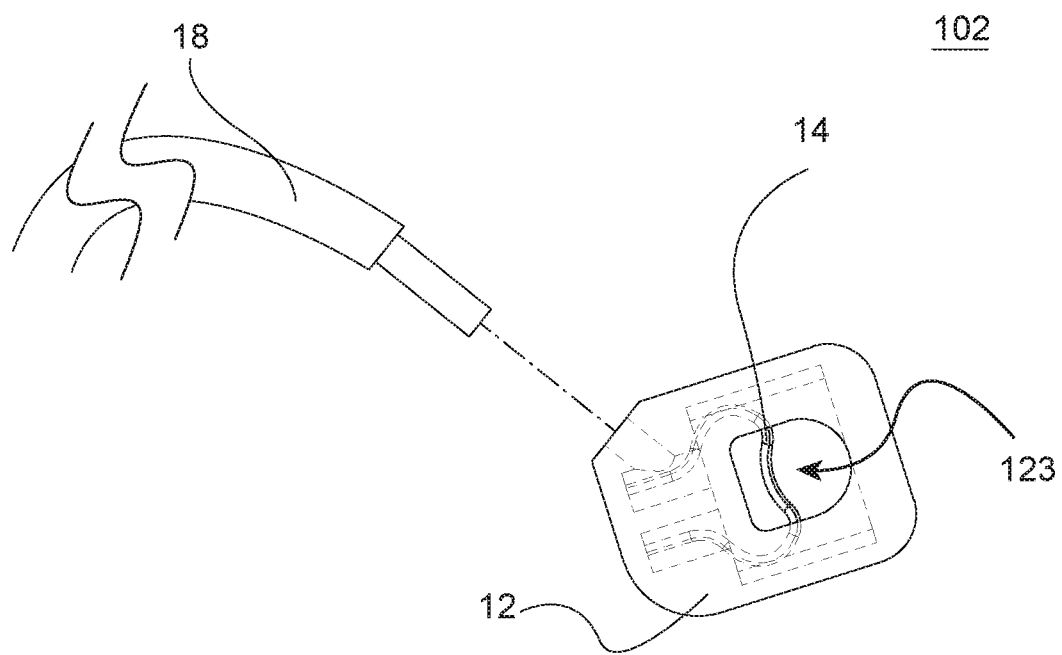
FIG. 11 is an exploded view of FIG. 10.

Referring to FIGS. 10 and 11 in cooperation with FIG. 2, in a third preferred embodiment of a pogo pin attaching device 102 of the invention, the pogo pin attaching device 102 is comprised of an insulating member 12, a metal attaching member 14 formed by bending an elastic metal piece, and a cable 18 electrically connected to the metal attaching member 14. The insulating member 12 is mounted on the metal attaching member 14. A through hole 123 is formed by the metal attaching member 14 and the insulating member 12. Specifically, the through hole 123 is defined and surrounded by the metal attaching member 14 and the insulating member 12. The through hole 123 is configured to put on a pogo pin 24.

Figure 12:
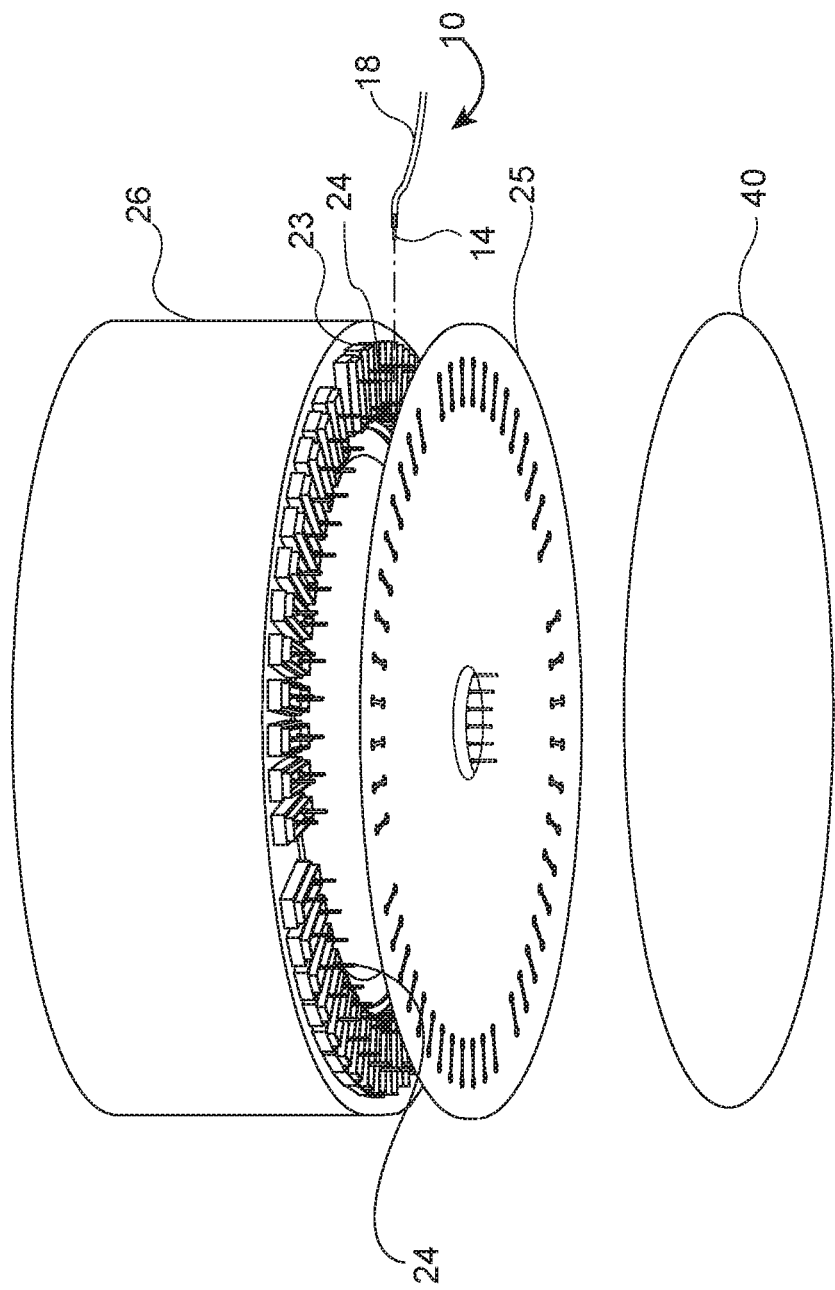
FIG. 12 schematically depicts the pogo pin attaching device ready to attach to a pogo pin interface of the automatic testing system for electrically connecting to a probe card according to the invention.

Referring to FIG. 12, it shows the pogo pin attaching device 10 is ready to attach one of a plurality of pogo pins 24 of the pogo pin interface 26. The probe card 25 or a probe carrier board (not shown) is further provided between the subject 40 and the pogo pin interface 26. In case of the subject 40 being a wafer produced by a semiconductor foundry, the automatic testing system may cooperate with the probe card 25 for probing devices or circuitry on subject 40. When the automatic testing system is activated for testing, the pogo pin interface 26 is docked with the probe card 25 (or the probe carrier board) which serves as a probing interface. In turn, each pogo pin 24 is electrically connected to the probe card 25 (or the probe carrier board). And the probe card 25 is electrically attached on subject 40. Thus, the subject 40 is electrically connected to the pogo pin attaching device 10.

Figure 13:
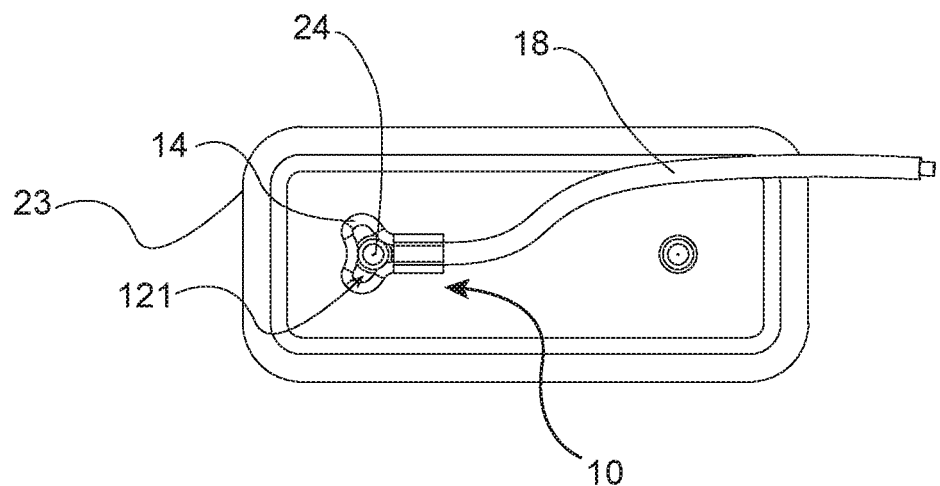
FIG. 13 schematically depicts the end view of pogo pin attaching device of FIG. 6 mounted with a pogo pin according to a first configuration of the invention.

Referring to FIG. 13 in cooperation with FIGS. 6, 7 and 12, the through hole 121 of the pogo pin attaching device 10 is put on the pogo pin 24 of a pogo pin cartridge 23. A user may push the pogo pin attaching device 10 to the root of pogo pin 24 so that a periphery of the pogo pin 24 contacts the metal attaching member 14 to electrically interconnect the pogo pin 24 and the metal attaching member 14.

Figure 14:
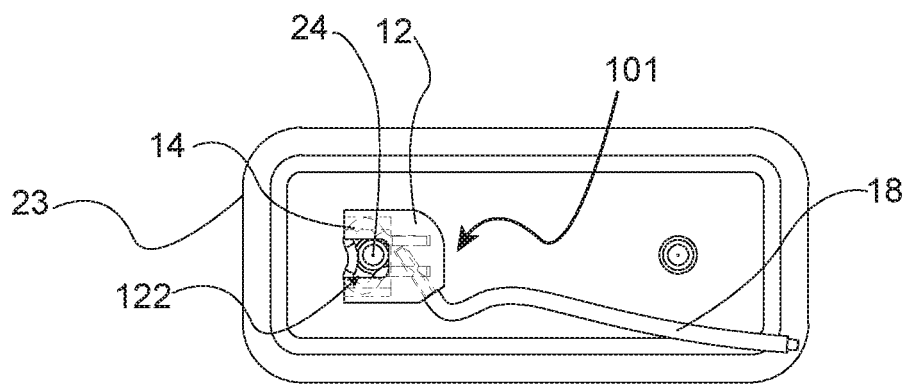
FIG. 14 schematically depicts the end view of pogo pin attaching device of FIG. 8 mounted with the pogo pin according to a second configuration of the invention.

Referring to FIG. 14 in cooperation with FIGS. 8, 9 and 12, the through hole 122 of the pogo pin attaching device 101 is put on the pogo pin 24 of the pogo pin cartridge 23. A user may push the insulating member 12 to the root of the pogo pin 24 so that a periphery of the pogo pin 24 contacts the metal attaching member 14 to electrically interconnect the pogo pin 24 and the metal attaching member 14.

Figure 15:
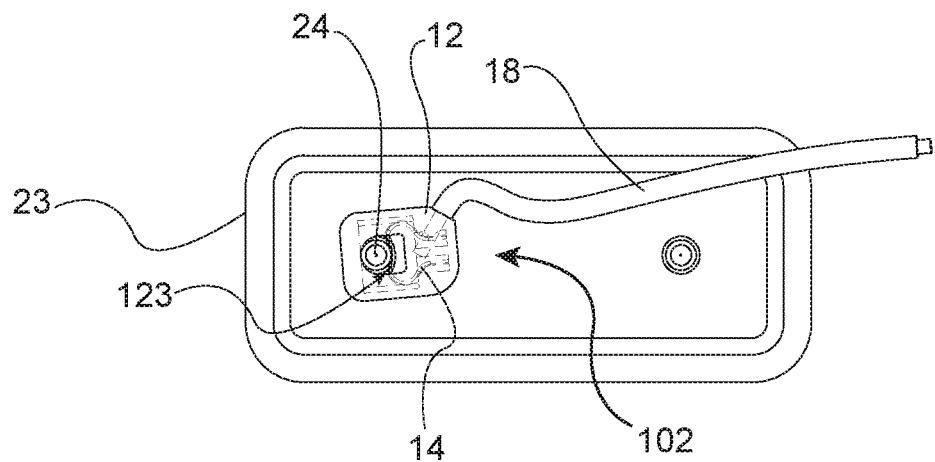
FIG. 15 schematically depicts the end view of pogo pin attaching device of FIG. 10 mounted with the pogo pin according to a third configuration of the invention.

Referring to FIG. 15 in cooperation with FIGS. 10 to 12, the through hole 123 of the pogo pin attaching device 102 is put on the pogo pin 24 of the pogo pin cartridge 23. A user may push the insulating member 12 to the root of the pogo pin 24 so that a periphery of the pogo pin 24 contacts both a side of metal attaching member 14 and an inner surface of the insulating member 12 to electrically interconnect the pogo pin 24 and the metal attaching member 14.

Preferably, the insulating member 12 is made of heat-resistant and insulated material such as polytetrafluoroethylene (PTFE), or other thermoplastic material. In case of the insulating member 12 being made of thermoplastic material such as perfluoroalkoxy alkanes (PFA), the insulating member 12 may be manufactured by metal injection molding or pressing molding.

While the invention has been described in terms of preferred embodiments, those skilled in the art will recognize that the invention can be practiced with modifications within the spirit and scope of the appended claims.

What is claimed is:

1. A method for upgrading an automatic testing system, comprising the steps of:
   (A) electrically connecting at least one pogo pin attaching device to an expansion instrument and a pogo pin of a pogo pin interface of the automatic testing system, wherein the pogo pin attaching device comprises at least one metal attaching member and at least one cable, each of said at least one cable having two opposite ends, a first end electrically connected to the metal attaching member, which includes a through hole, and a second end electrically connected to the expansion instrument, and the metal attaching member is attached to the pogo pin received in the through hole; and
   (B) in response to operating the automatic testing system, electrically connecting the pogo pin to a subject so that a measurement path is established between the subject and the expansion instrument through the pogo pin attaching device wherein the measurement path is configured to connect signals for upgrading the automatic testing system.

2. The method of claim 1, further comprising an insulating member mounted with the metal attaching member.

3. The method of claim 1, further comprising a system control computer electrically connected to the expansion instrument for controlling the expansion instrument.

4. The method of claim 2, further comprising a system control computer electrically connected to the expansion instrument for controlling the expansion instrument.

5. The method of claim 1, further comprising a wire box electrically interconnected the expansion instrument and the pogo pin attaching device, the wire box being configured to relay cabling between the expansion instrument and the pogo pin attaching device to prevent tension caused damage to the pogo pin.

6. The method of claim 5, further comprising a relay module in the wire box, the relay module being programmable, the relay module being configured to turn on to interconnect the pogo pin attaching device and the expansion instrument for signal communication or turn off to disconnect the pogo pin attaching device from the expansion instrument, thereby decreasing interference of the pogo pin attaching device to a sensitive measurement function of the automatic testing system.

7. The method of claim 6, further comprising a relay driving unit disposed externally of the wire box, the relay driving unit being electrically connected to the relay module and the system control computer respectively so that the system control computer is configured to execute software programs to control the relay driving unit.

8. The method of claim 1, wherein the metal attaching member of the pogo pin attaching device is implemented as a wire form spring or a bending elastic metal piece.

9. The method of claim 1, wherein a periphery of the pogo pin contacts both a side of metal attaching member and an inner surface of the insulating member.

10. The method of claim 1, further comprising a probe card disposed between the subject and the pogo pin interface so that when the automatic testing system is activated for testing, the pogo pin contacts the probe card which serves as a probing interface, thereby electrically connecting the subject.

* * * * *